(12) United States Patent
Preuβ et al.

(10) Patent No.: US 8,482,025 B2
(45) Date of Patent: Jul. 9, 2013

(54) OPTOELECTRONIC SEMICONDUCTOR COMPONENT

(75) Inventors: Stephan Preuβ, Bad Abbach (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/375,813

(22) PCT Filed: May 5, 2010

(86) PCT No.: PCT/EP2010/056118
§ 371 (c)(1),
(2), (4) Date: Dec. 22, 2011

(87) PCT Pub. No.: WO2010/139518
PCT Pub. Date: Dec. 9, 2010

(65) Prior Publication Data
US 2012/0126279 A1    May 24, 2012

(30) Foreign Application Priority Data
Jun. 4, 2009   (DE) .......................... 10 2009 023 854

(51) Int. Cl.
*H01L 33/00* (2010.01)

(52) U.S. Cl.
USPC ............. 257/99; 257/723; 257/784; 257/778; 438/108; 438/125

(58) Field of Classification Search
USPC ............... 257/99, 79, 81, 84, 431, 678, 685, 257/686, 690, 734, 777, 778, 779, 780, 781, 257/782, 783, 784, 786, 723, 80, 82, 666, 257/670, 671; 438/106, 107, 108, 109, 110, 438/118, 125, 121; 361/760, 761, 762, 749
See application file for complete search history.

(56) References Cited

U.S. PATENT DOCUMENTS

| 4,649,418 A * | 3/1987 | Uden ............................ 257/679 |
| 6,185,240 B1 | 2/2001 | Jiang et al. |
| 6,781,484 B2 * | 8/2004 | Matsuta ........................ 333/193 |
| 7,695,990 B2 * | 4/2010 | Sorg et al. ........................ 438/26 |
| 2003/0047798 A1 * | 3/2003 | Halahan ........................ 257/685 |
| 2004/0017008 A1 * | 1/2004 | Ueda ............................ 257/734 |
| 2007/0018191 A1 | 1/2007 | Roh et al. |

(Continued)

FOREIGN PATENT DOCUMENTS

| CA | 2 549 822 A1 | 5/2005 |
| DE | 699 09 343 T2 | 2/2004 |

(Continued)

*Primary Examiner* — Thanh Y Tran
(74) *Attorney, Agent, or Firm* — DLA Piper LLP (US)

(57) ABSTRACT

An optoelectronic semi-conductor component includes a first carrier having a top side and an underside laying opposite the top side of the first carrier, wherein the first carrier has a first and a second region; at least one optoelectronic semiconductor chip arranged at the top side on the first carrier; and at least one electronic component arranged in the second region at the underside of the first carrier, wherein the first region has a greater thickness in a vertical direction than the second region, wherein, at the underside, the first region projects beyond the second region in a vertical direction, and the at least one electronic component is electrically conductively connected to the at least one optoelectronic semi-conductor chip.

11 Claims, 4 Drawing Sheets

U.S. PATENT DOCUMENTS

| | | |
|---|---|---|
| 2007/0075451 A1 | 4/2007 | Winter et al. |
| 2008/0012125 A1 | 1/2008 | Son et al. |
| 2008/0099779 A1 | 5/2008 | Huang et al. |
| 2009/0160036 A1* | 6/2009 | Grey .......................... 257/666 |
| 2011/0002587 A1 | 1/2011 | Bogner et al. |

FOREIGN PATENT DOCUMENTS

| | | |
|---|---|---|
| DE | 10 2007 001 706 A1 | 7/2008 |
| EP | 0 921 568 A2 | 6/1999 |
| EP | 0 933 842 A2 | 8/1999 |
| EP | 1 770 797 A2 | 4/2007 |
| EP | 1 912 263 A2 | 4/2008 |
| EP | 1 998 380 A2 | 12/2008 |
| JP | 5-37021 A | 2/1993 |
| JP | 5-327027 A | 12/1993 |
| JP | 5-347434 A | 12/1993 |
| JP | 2007-150229 A | 6/2007 |
| JP | 2008-22006 A | 1/2008 |
| WO | 2005/043627 A1 | 5/2005 |
| WO | 2008/083672 A2 | 7/2008 |

* cited by examiner

OPTOELECTRONIC SEMICONDUCTOR COMPONENT

RELATED APPLICATIONS

This is a §371 of International Application No. PCT/EP2010/056118, with an international filing date of May 5, 2010 (WO 2010/139518, published Dec. 9, 2010), which is based on German Patent Application No. 10 2009 023 854.9, filed Jun. 4, 2009, the subject matter of which is hereby incorporated by reference.

TECHNICAL FIELD

This disclosure relates to a particularly compact semiconductor component.

SUMMARY

We provide an optoelectronic semiconductor component including a first carrier having a top side and an underside lying opposite the top side of the first carrier, wherein the first carrier has a first and a second region, at least one optoelectronic semiconductor chip arranged at the top side on the first carrier, and at least one electronic component arranged in the second region at the underside of the first carrier, wherein the first region has a greater thickness in a vertical direction than the second region, wherein, at the underside, the first region projects beyond the second region in a vertical direction, and the at least one electronic component is electrically conductively connected to the at least one optoelectronic semiconductor chip.

We also provide an optoelectronic semiconductor component including a first carrier having a top side and an underside lying opposite the top side of the first carrier, wherein the first carrier has a first and a second region, at least one optoelectronic semiconductor chip arranged at the top side on the first carrier, and at least one electronic component arranged in the second region at the underside of the first carrier, wherein the first region has a greater thickness in a vertical direction than the second region, at the underside, the first region projects beyond the second region in a vertical direction, the at least one electronic component is electrically conductively connected to the at least one optoelectronic semiconductor chip, the optoelectronic semiconductor chip is electrically conductively connected to a further carrier by a bonding wire, and the electronic component is electrically conductively connected to the further carrier by a further bonding wire.

We further provide an optoelectronic semiconductor component including a first carrier having a top side and an underside lying opposite the top side of the first carrier, wherein the first carrier has a first and a second region, at least one optoelectronic semiconductor chip arranged at the top side on the first carrier, and at least one electronic component arranged in the second region at the underside of the first carrier, wherein the first region has a greater thickness in a vertical direction than the second region, at the underside, the first region projects beyond the second region in a vertical direction, the at least one electronic component is electrically conductively connected to the at least one optoelectronic semiconductor chip, the second region is formed by an undercut in the first carrier, and the undercut is a marginal cutout in the first carrier which is freely accessible from the outside and is delimited by at least two side areas of the first carrier.

DETAILED DESCRIPTION

Figure 1A:
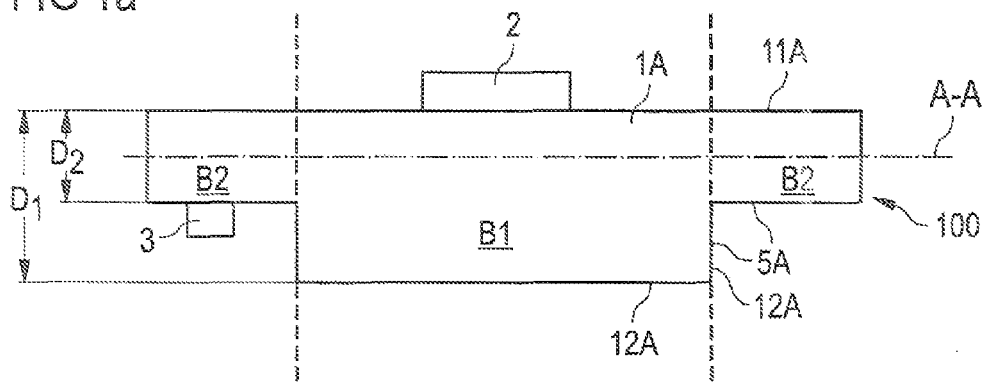
FIGS. 1a, 1b, 2a, 2b, 2c, 2d and 2e show schematic views of examples of an optoelectronic semiconductor component.

The optoelectronic semiconductor component may comprise a first carrier. The carrier has a top side and an underside lying opposite the top side. The first carrier can be a carrier plate composed of electrically conductive material, for example, a metal, which serves as an electrical contact area for the semiconductor component.

The first carrier can also be formed with a base body composed of electrically insulating material, for example, a ceramic. The base body can then be provided with connection locations and conductor tracks at the top side and/or the underside.

The first carrier has a first and a second region. That is to say, the first carrier is subdivided into regions, wherein the regions differ with regard to at least one physical property, for example, their thickness in a vertical direction. In this case "thickness" means the extent of each of the two regions, wherein "vertical" denotes a direction perpendicular to a main extension plane of the first carrier. Therefore, in this context, "region" is any three-dimensional structure which shapes and forms the carrier at least in places. In this respect, the first region together with the second region forms the first carrier. The first and second regions preferably merge directly into one another such that neither a gap nor an interruption is formed between the first and the second region. By way of example, the first carrier is formed in one piece and/or the first and the second regions are formed with the same material.

The first region may have a greater thickness in a vertical direction than the second region.

At least one optoelectronic semiconductor chip may be arranged at the top side onto the first carrier. The optoelectronic semiconductor chip can be a luminescence diode chip, for example. The luminescence diode chip can be a light emitting or laser diode chip that emits radiation in the range from ultraviolet to infrared light. Preferably, the luminescence diode chip emits light in the visible range or ultraviolet range of the spectrum of the electromagnetic radiation. Likewise, the optoelectronic semiconductor chip can also be a radiation-receiving chip, for example, a photodiode.

The at least one optoelectronic semiconductor chip is arranged, for example, in the first region at the top side.

The optoelectronic semiconductor component may have at least one, for example, exactly one, electronic component arranged in the second region at the underside of the first carrier.

The first region projects beyond the second region at the underside in a vertical direction. That can mean that the top side of the first carrier is a plane without elevations or depressions and is thus "planar" while the underside, on account of the first region projecting beyond the second region, has an elevation, for example, in the form of a step. In other words, the carrier is subdivided into at least two regions in a lateral direction, wherein the carrier has a greater thickness in a vertical direction in the first region than in the second region.

Furthermore, the at least one electronic component is electrically conductively connected to the at least one optoelectronic semiconductor chip. By way of example, this can be realized by the first carrier itself being electrically conductive or an electrical contact between the electronic component and the optoelectronic semiconductor chip being produced by electrical conductor tracks and contact connections.

The semiconductor component may comprise a first carrier, which has a top side and an underside lying opposite the top side of the first carrier, wherein the first carrier has a first and a second region. Furthermore, the optoelectronic semiconductor component has at least one optoelectronic semiconductor chip arranged at the top side on the first carrier. The optoelectronic semiconductor component also has at least one electronic component arranged in the second region at the underside of the first carrier. The first region has a greater thickness in a vertical direction than the second region, wherein, at the underside, the first region projects beyond the second region in a vertical direction and the at least one electronic component is electrically conductively connected to the at least one optoelectronic semiconductor chip.

In this case, the optoelectronic semiconductor component described here is based on the insight, inter alia, that fitting an electronic component on the same area, for example, of a top side of a carrier, alongside a semiconductor chip, for example, is space-consuming since the top side then has to be chosen to be large enough such that both components, the optoelectronic semiconductor chip and the electronic component, can be fitted jointly on the top side. In particular, this leads to restrictions in the constitution and the geometry of the carrier, since, for example, it is necessary to find a compromise between the size of the semiconductor component and the emission properties of the semiconductor component.

To provide a semiconductor component which is especially compact and space-saving, the optoelectronic semiconductor component described here makes use of a carrier having a first and a second region, wherein the first region has a greater thickness in a vertical direction than the second region and, at the underside, projects beyond the second region in a vertical direction. An electronic component is then arranged at the underside in the second region of the first carrier, wherein an optoelectronic semiconductor chip is simultaneously arranged at the top side of the carrier. Optoelectronic semiconductor chip and electronic component are thus situated at opposite sides of the carrier.

The positioning of the electronic component on a side lying opposite the top side, and thus also the semiconductor chip, thus advantageously makes it possible to reduce at least the lateral extent of the carrier or of the optoelectronic semiconductor component.

Furthermore, the underside, which is designed to fit the electronic component and to which the at least one electronic component is fitted can serve as an electrical contact marking for the semiconductor component. That is to say that, for example, the second region or the electronic component itself can serve as a cathode marking.

The at least one electronic component may not project beyond the first carrier in a vertical direction. That can mean that the first region projects beyond the electronic component or the at least one electronic component terminates flush with the first region in a lateral direction. Advantageously, by virtue of the fact that the at least one electronic component does not project beyond the first carrier in a vertical direction, the vertical extent of the component is kept as small as possible since in this case the thickness of the first region together with the vertical extent of the at least one optoelectronic semiconductor chip can simultaneously be the maximum vertical extent of the entire semiconductor component. Furthermore, the underside, in the first region, can then form a mounting or contact area for the semiconductor component.

The second region may be formed by an undercut in the first carrier. In this context, "undercut" means a marginal cutout in the first carrier which is freely accessible from the outside and is delimited by at least two side areas of the first carrier. By way of example, the undercut is introduced into the first carrier by etching, embossing, stamping, sawing, milling or some other form of material removal. By way of example, as a result of the undercut, the thickness is increased in a vertical direction proceeding from the second region in the direction of the first region "suddenly," for example, in the form of a step. In this context, "suddenly" means that the underside has a change in the vertical extent in a lateral direction, that is to say parallel to the main extension plane of the first carrier, from one location to the next in a predeterminable manner. It is likewise possible for the second region to be formed by a multiplicity of undercuts, which then form a stepped staircase structure. It is then conceivable for an electronic component in each case to be fitted on one or a plurality of steps.

The second region may be formed by a cutout in the first carrier. The cutout is a depression in the carrier which has an opening and is freely accessible from the underside. Furthermore, the cutout has, for example, a bottom area and at least one side area. Bottom and side areas are formed by the carrier. The bottom area can be situated on that side of the cutout which lies opposite the opening. The opening and the bottom area are connected to one another by the side area. In this case, too, it is possible that, instead of only one cutout, a plurality of cutouts of different extents are introduced into the first carrier, which then respectively form staircase-shaped projections to which, for example, an electronic component is in each case fitted.

The second region may border the first region at least three sides. It is likewise possible for the second region to enclose the first region completely, for example, in a frame-shaped manner. By way of example, an undercut forming the second region runs along the edge of the first carrier at three sides.

The optoelectronic semiconductor chip and the electronic component may in each case be electrically conductively connected to a further carrier by a bonding wire. The further carrier can be formed from materials identical to or different than the first carrier. Furthermore, the further carrier can have the same geometrical features, for example, with regard to the subdivision into a first and a second region. By way of example, the further carrier, in the same way as the first carrier, is formed by a first and a second region, wherein, in this case too, the first region projects beyond the second region in a vertical direction at the underside. The further electronic component can then be arranged in the second region at the underside of the further carrier.

The at least one optoelectronic semiconductor chip may be bordered laterally by a housing body. The housing body then covers the top side of the first and/or of the further carrier at least in places. By way of example, in a lateral direction the housing body borders the optoelectronic semiconductor chip in a circular, oval or rectangular fashion. By way of example, the housing body covers the surface of the first and/or second carrier completely apart from a chip mounting region. The housing body can be formed with a thermosetting plastic or thermoplastic material, for example, an epoxide, or else be formed with a ceramic material or consist of such a material. It is likewise possible for the housing body to be formed with a silicone or other, for example, rubber-like, materials or mixtures of the materials mentioned.

The housing body may reshape the at least one electronic component at least in places. In this context, "reshapes" means that the housing body is in direct contact with the electronic component and encloses the electronic component at least in places and, therefore, neither a gap nor an interruption is formed between the housing body and the electronic component. The electronic component is thus advantageously protected by the housing body against external influences such as, for example, moisture or mechanical loads. That is to say that the first carrier is then free of the housing body at the underside only in the first region and is covered by the housing body in the second region.

Advantageously, as a result of the positioning of the electronic component on the underside of the first carrier the vertical extent of the housing body above the top side of the first carrier, alongside the vertical extent of the optoelectronic semiconductor chip, no longer additionally has to include the vertical extent of the electronic component and of a possible bonding contact. This leads to an especially flat housing since only the vertical extent of the at least one optoelectronic semiconductor chip is crucial for the vertical extent of the housing body.

It is likewise possible to realize a housing body which has a small lateral extent as a result of the decrease in size of the top side of the first carrier.

The housing body may not project beyond the first region at the underside in a vertical direction. If the electronic component does not project beyond the first region, then it is conceivable that the housing body also does not project beyond the first region. It is likewise possible for the housing body to terminate in a lateral direction flush with the underside in the first region.

This advantageously makes it possible that the locations of the first region which are exposed at the underside of the first carrier can serve as a contact or mounting area for the semiconductor component, while the second region with the electronic component is completely covered by the housing body.

The housing body may mechanically connect the first carrier to the further carrier. That can mean that, alongside the first carrier, the further carrier is also covered with the housing body at least in places at its top side and/or underside and the side areas and the housing body thus prevents the two carriers from mechanically slipping relative to one another. This advantageously provides a component which is especially stable with respect to external mechanical action, for example, and the first carrier and the further carrier are thus stabilized in terms of their position with respect to one another. Furthermore, the housing body can be electrically insulating between the two carriers.

The electronic component may contain or may be a protective circuit for protection against damage by electrostatic charging. By way of example, the electronic component can be an ESD (electrostatic discharge) protective element. The ESD protective element is suitable for dissipating voltage spikes that occur, for example, in a reverse direction of the optoelectronic semiconductor chip. The ESD protective element is, for example, one of the following components: varistor, light emitting diode chip, Zener diode, resistor. The ESD protective element is then connected in parallel or reverse-connected in parallel with the optoelectronic semiconductor chip.

If the electronic component is a light emitting diode chip, for instance, and the latter is reverse-connected in parallel with the optoelectronic semiconductor chip the light emitting diode chip can then likewise be utilized for generating radiation.

The at least one electronic component may contain a drive circuit for the at least one optoelectronic semiconductor chip. The optoelectronic semiconductor chip can be controlled with the drive circuit, for example, with regard to brightness and evolution of heat.

The components described here will be explained in greater detail below on the basis of examples and with reference to the associated Drawings.

In the examples and in the Drawings, identical or identically acting constituent parts are in each case provided with the same reference symbols. The elements illustrated should not be regarded as true to scale. Rather, individual elements may be illustrated with an exaggerated size to afford a better understanding.

FIG. 1a shows, in a schematic sectional illustration along a sectional line A-A, one example of an optoelectronic semiconductor component 100. The first carrier 1A has a top side 11A and an underside 12A lying opposite the top side 11A.

Furthermore, the first carrier 1A has a first region B1 and a second region B2. The second region B2 is formed by an undercut 5A, wherein the first region B1 has a thickness D1 and the second region B2 has a thickness D2. The undercut 5A is delimited by two side areas of the carrier 1A, wherein an electronic component 3 is fitted on one of the side areas. In the first region B1, an optoelectronic semiconductor chip 2 is fitted to a top side 11A of the carrier 1A. The optoelectronic semiconductor chip 2 and the electronic component 3 are therefore situated at opposite sides of the carrier 1A. In the present case, the thickness D1 of the first region B1 is greater than the added thickness D2 of the second region B2 and the vertical extent of the electronic component 3.

Figure 1B:
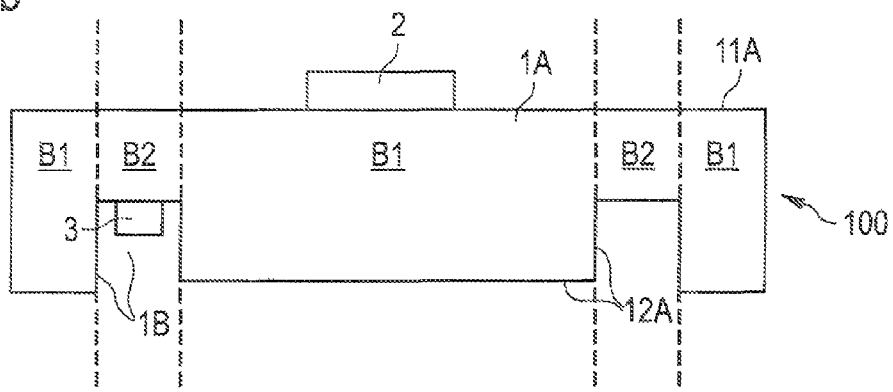

FIG. 1b describes, on the basis of a schematic sectional illustration, a further example in accordance with an optoelectronic semiconductor component 100, wherein the second region B2 is formed by a cutout 13. In the present case, the cutout 13 is delimited laterally in each case by three side areas of the carrier 1A. The electronic component 3 is fitted to a bottom area of the cutout 13. In particular, the cutout 13 advantageously provides the electronic component with protection against external effects such as mechanical loading, for example.

Both in FIG. 1a and FIG. 1b the second region B2 borders the first region B1 at three sides.

Figure 2A:
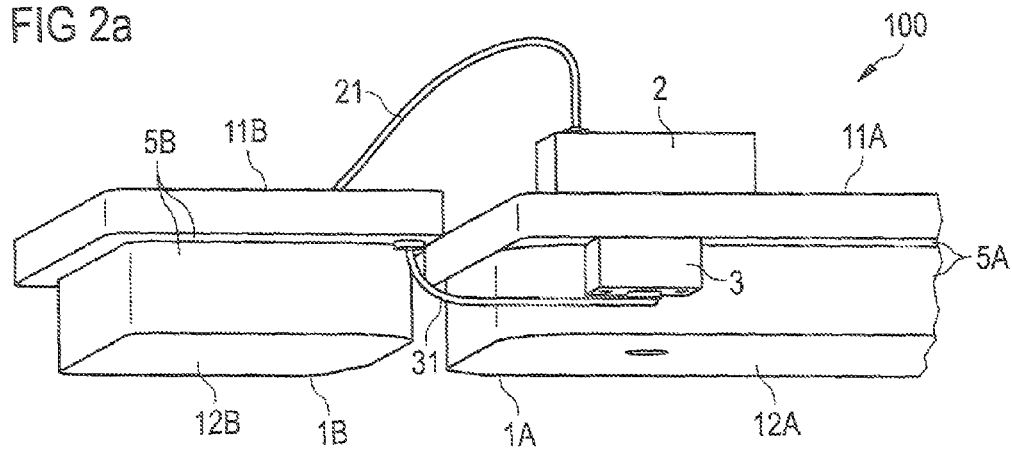

The example in accordance with FIG. 1a comprising the first carrier 1A and the optoelectronic semiconductor chip 2 fitted on the top side of the carrier 1A is explained in greater detail on the basis of a schematically perspective side view in FIG. 2a. In this example, the carrier 1A is a metallic carrier strip, for example, comprised of copper, by which electrical contact is made with the semiconductor chip 2. Furthermore, the optoelectronic semiconductor chip 2 is electrically conductively contact-connected to a further carrier 1B by a bonding wire contact 21. The further carrier 1B can likewise be a metallic carrier strip, for example, composed of copper. Furthermore, it is conceivable for the first carrier 1A and/or the further carrier 1B to be formed from a ceramic material, wherein electrical contact is then made with the optoelectronic semiconductor chip 2 by means of conductor tracks and contact locations applied on the carriers 1A and 1B. The carriers 1A and 1B are furthermore electrically insulated from one another. Furthermore, the carrier 1B also has an underside 12B and an undercut 5B introduced by the second carrier 1B. By way of example, the undercut 5B is introduced into the carrier 1B by an etching process. With a bonding wire contact 31, the electronic component 3 is electrically conductively contact-connected to the further carrier 1B, wherein the undercut 5B serves as a contact region for the bonding wire contact 31. The electronic component 3 is a component having an ESD protective circuit.

Figure 2B:
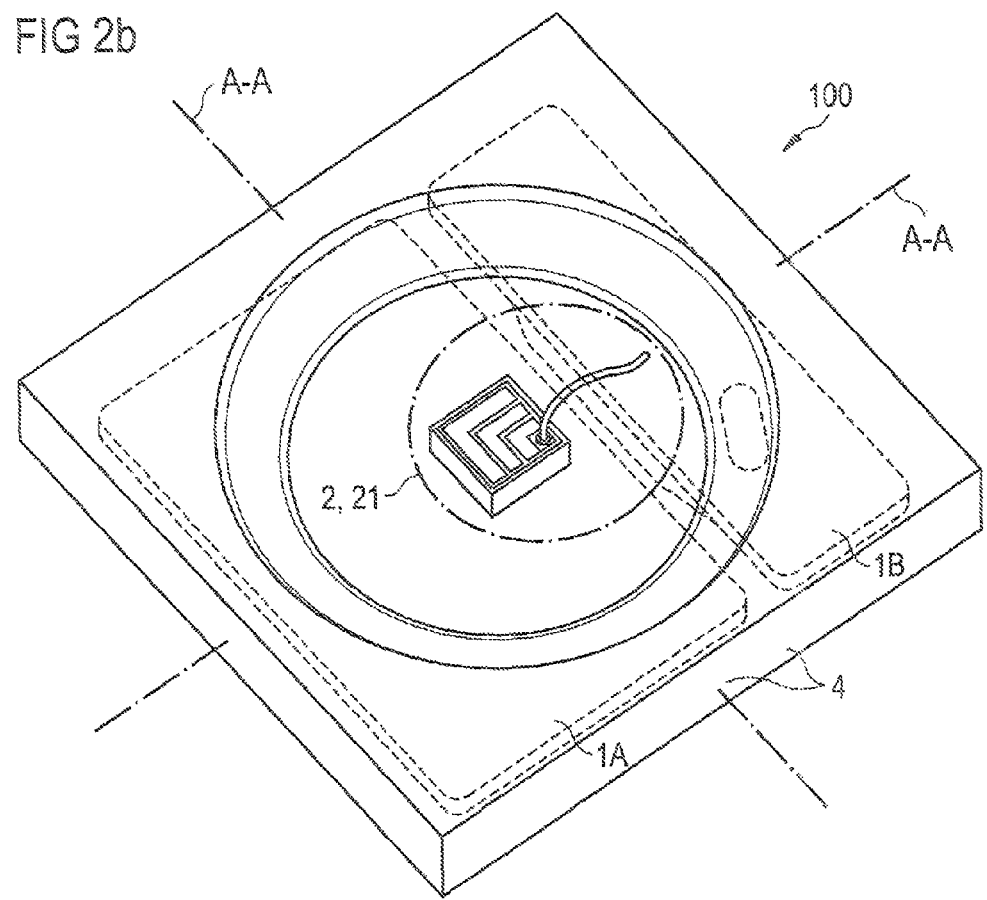

FIG. 2b shows the example in accordance with FIGS. 1a and 2a in a schematically perspective plan view. In comparison with the semiconductor component 100 shown in FIG. 1a, the semiconductor component 100 is now provided with a housing body 4. The housing body borders the semiconductor chip 2 in a circular fashion and covers all exposed locations of the top sides 11A and 11B of the carriers 1A and 1B. The housing body 4 mechanically connects the two carriers 1A and 1B to one another. Furthermore, the housing body 4 provides for an electrical insulation of the two carriers 1A and 1B. In the present case, the housing body 4 is formed with a thermosetting plastic or thermoplastic material, for example, an epoxide. It is likewise possible that the housing body 4 can be formed with a ceramic material or can consist of such material.

Figure 2C:
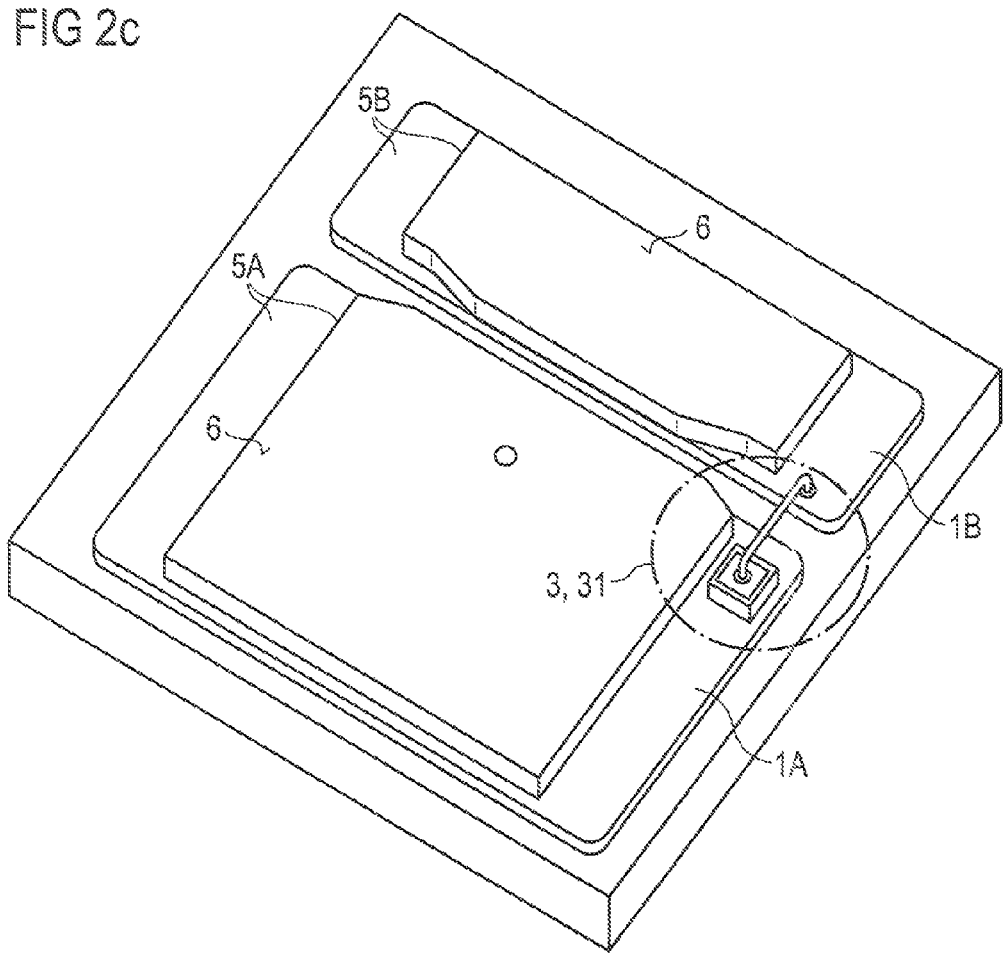

FIG. 2c shows the example in accordance with FIG. 2b in a schematically perspective bottom view. The electronic component 3 fitted to the undercut 5A is again discernable, which electronic component is electrically contact-connected to the further carrier 1B in the region of the undercut 5B by the bonding wire contact 31. Furthermore it can be discerned that the housing body 4 completely reshapes the electronic component 3 and terminates flush with a contact area 6 in a lateral direction.

Figure 2E:
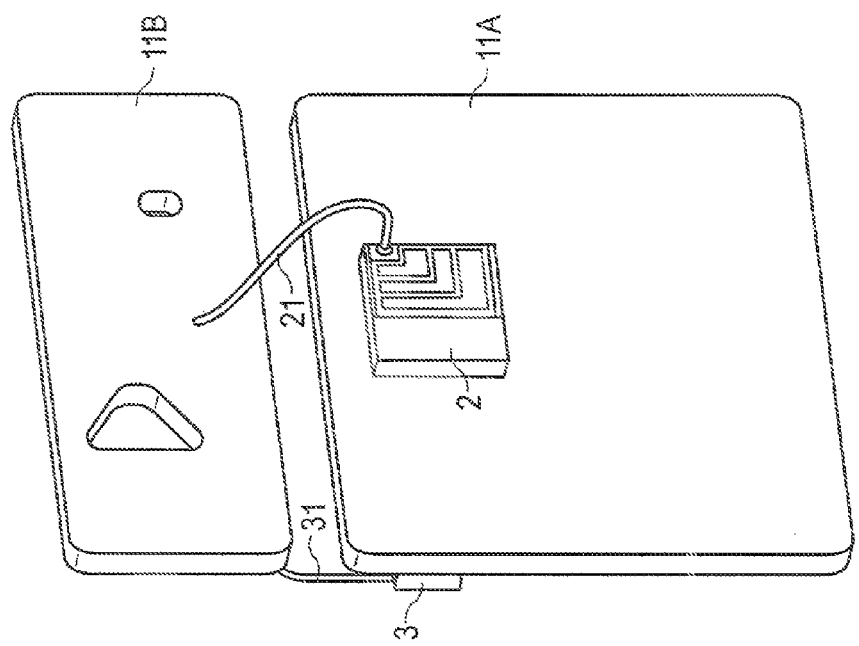
Figure 2D:
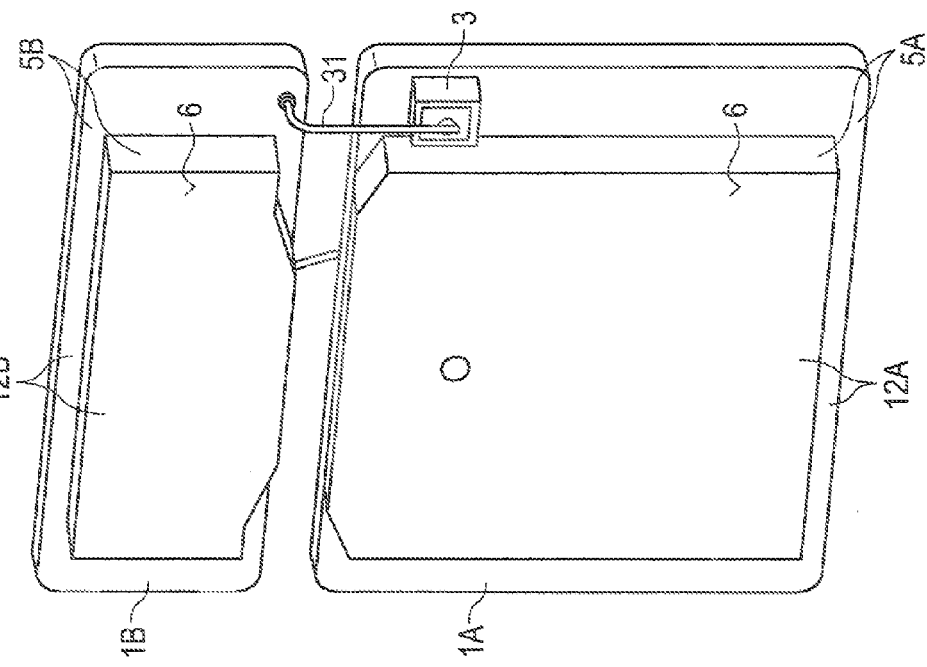

FIGS. 2d and 2e show further schematic side and bottom views of the example in accordance with FIGS. 1a and 2a, 2b and 2c.

This disclosure is not restricted by the description on the basis of the examples. But rather, the disclosure encompasses any novel feature and any combination of features, which in particular includes any combination of features in the appended claims even if the feature or the combination itself is not explicitly specified in the claims or the example.

The invention claimed is:

1. An optoelectronic semiconductor component comprising
a first carrier having a topside and an underside lying opposite the top side of the first carrier, wherein the first carrier has a first and a second region;
at least one optoelectronic semiconductor chip arranged at the to side on the first carrier; and
at least one electronic component arranged in the second region at the underside of the first carrier,
wherein the first region has a greater thickness in a vertical direction than the second region,
at the underside, the first region projects beyond the second region in a vertical direction,
the at least one electronic component electrically conductively connects to the at least one optoelectronic semiconductor chip,
the optoelectronic semiconductor chip electrically conductively connects to a further carrier with a bonding wire and the electronic component electrically conductively connects to the further carrier with a further bonding wire, and
the first carrier and the further carrier are electrically insulated in a lateral direction by a housing body and the lateral direction is a direction parallel to the to side or the underside of the first carrier.

2. The optoelectronic semiconductor component according to claim 1, wherein the at least one electronic component does not project beyond the first carrier in a vertical direction.

3. The optoelectronic semiconductor component according to claim 1, wherein the second region is formed by an undercut in the first carrier.

4. The optoelectronic semiconductor component according to claim 1, wherein the second region is formed by a cutout in the first carrier.

5. The optoelectronic semiconductor component according to claim 1, wherein the second region borders the first region at at least three sides.

6. The optoelectronic semiconductor component according to claim 1, wherein the at least one optoelectronic semiconductor chip is bordered laterally by a housing body.

7. The optoelectronic semiconductor component according to claim 6, wherein the housing body reshapes the at least one electronic component at least in selected places.

8. The optoelectronic semiconductor component according to claim 6, wherein the housing body does not project beyond the first region in a vertical direction at the underside.

9. The optoelectronic semiconductor component according to claim 6, wherein the housing body mechanically connects the first carrier to the further carrier.

10. The optoelectronic semiconductor component according to claim 1, wherein the at least one electronic component contains a protective circuit that protects against damage caused by electrostatic charging.

11. The optoelectronic semiconductor component according to claim 1, wherein the at least one electronic component contains a drive circuit for the at least one optoelectronic semiconductor chip.

* * * * *

UNITED STATES PATENT AND TRADEMARK OFFICE
CERTIFICATE OF CORRECTION

PATENT NO. : 8,482,025 B2
APPLICATION NO. : 13/375813
DATED : July 9, 2013
INVENTOR(S) : Preuß et al.

It is certified that error appears in the above-identified patent and that said Letters Patent is hereby corrected as shown below:

On the Title Page

At item (12) and (75), please correct the inventor's name from "Preuβ" to -- Preuß --.

In the Claims

In Column 7

In claim 1, line 31, please change "topside" to -- top side --; and at line 35, please change "the to side" to -- the top side --.

Signed and Sealed this
Twenty-ninth Day of October, 2013

Teresa Stanek Rea
*Deputy Director of the United States Patent and Trademark Office*